United States Patent
Kim et al.

(10) Patent No.: US 11,619,955 B2
(45) Date of Patent: Apr. 4, 2023

(54) THERMOSTAT POWER WIRE SWITCHING CIRCUIT

(71) Applicant: Ademco Inc., Golden Valley, MN (US)

(72) Inventors: Hyunki Kim, Rogers, MN (US); Robert D. Juntunen, Minnetonka, MN (US)

(73) Assignee: Ademco Inc., Golden Valley, MN (US)

( * ) Notice: Subject to any disclaimer, the term of this patent is extended or adjusted under 35 U.S.C. 154(b) by 452 days.

(21) Appl. No.: 16/793,878

(22) Filed: Feb. 18, 2020

(65) Prior Publication Data

US 2021/0255648 A1  Aug. 19, 2021

(51) Int. Cl.
| | | |
|---|---|---|
| H03K 17/687 | (2006.01) | |
| H03K 17/689 | (2006.01) | |
| G05D 23/19 | (2006.01) | |
| F24F 11/88 | (2018.01) | |
| F24F 11/00 | (2018.01) | |

(52) U.S. Cl.
CPC .............. *G05D 23/19* (2013.01); *F24F 11/88* (2018.01); *H03K 17/689* (2013.01); *H03K 17/6871* (2013.01); *H03K 17/6877* (2013.01); *F24F 11/00* (2013.01)

(58) Field of Classification Search
CPC ........... H03K 17/6871; H03K 17/6877; H03K 17/689; H03K 17/002; G05D 23/1902
See application file for complete search history.

(56) References Cited

U.S. PATENT DOCUMENTS

| | | | |
|---|---|---|---|
| 8,523,083 B2* | 9/2013 | Warren | F24F 11/38 |
| | | | 439/828 |
| 9,046,898 B2 | 6/2015 | Mucignat et al. | |
| 2004/0245349 A1* | 12/2004 | Smith | F23N 5/203 |
| | | | 236/10 |
| 2007/0045432 A1* | 3/2007 | Juntunen | F23N 5/203 |
| | | | 236/46 R |
| 2009/0140065 A1 | 6/2009 | Juntunen et al. | |
| 2018/0119976 A1* | 5/2018 | Kadah | F24F 11/89 |

* cited by examiner

*Primary Examiner* — Metasebia T Retebo
(74) *Attorney, Agent, or Firm* — Greenberg Traurig, LLP; Ryan D. Sharp; David J. Dykeman

(57) ABSTRACT

A switch circuit configured to receive power from either a single power source or dual power source. The circuit includes two power input terminals and two power output terminals. For a single power source, the switch circuit may receive the single power source at either of the two power input terminals. The switch circuit provides power to a load without regard to which of the power input terminals the single power source is connected. The switch circuit shorts the power output terminals for a single power input, which provides power at both power output terminals. For a dual power source system, the switch circuit may isolate the two power output terminals so each power output terminal may operate independently without shorting. In some examples, the switch circuit may be part of a thermostat or similar HVAC system controller.

17 Claims, 4 Drawing Sheets

THERMOSTAT POWER WIRE SWITCHING CIRCUIT

TECHNICAL FIELD

The disclosure relates heating, ventilation and air conditioning (HVAC) thermostats.

BACKGROUND

Thermostats used for HVAC systems may include terminals for wiring that provide power to the thermostat. Some HVAC systems may include a single power source, while other systems include at least two power sources. Some examples of powered thermostats may include mechanisms such as jumpers or mechanical switches, so that the thermostat may be used with either a single power source or multiple power source HVAC system.

SUMMARY

In general, the disclosure is directed to a switch circuit added to a thermostat or similar HVAC system controller, in which the switch circuit is configured to receive power from either a single power source or dual power source HVAC system. The circuit includes two power input terminals and two power output terminals. For a single power source HVAC system, the switch circuit may receive the single power source at either of the two power input terminals. The switch circuit provides power to the thermostat without regard to which of the power input terminals the single power source is connected. The switch circuit shorts the power output terminals for a single power input, which provides power at both power output terminals. For a dual power source HVAC system, the switch circuit may isolate the two power output terminals so each power output terminal may operate independently without shorting. The switch circuit may simplify and reduce errors during thermostat installation for an HVAC system.

In one example, the disclosure is directed to a circuit for receiving power from a heating, ventilation, and air-conditioning device, the circuit comprising: a first switching circuit comprising: a first input terminal; a first output terminal; a first switch with a first control terminal; and a first control node. The circuit also includes a second switching circuit comprising: a second input terminal; a second output terminal electrically connected to the first output terminal; a second switch with a second control terminal connected to the first control node; and a second control node connected to the first control terminal. In response to receiving a voltage at the first input terminal, the first switching circuit is configured to control the second switch via the first control node to isolate the second input terminal from the second output terminal, and in response to receiving a voltage at the second input terminal, the second switching circuit is configured to control the first switch via the second control node to isolate the first input terminal from the first output terminal.

In another example, the disclosure is directed to system for controlling heating, ventilation and air conditioning (HVAC) equipment, the system comprising: one or more processors configured to receive signals from one or more sensors; a switch circuit configured to provide power to the system and the one or more processors. The switch circuit comprises: a first switching circuit comprising: a first input terminal; a first output terminal; a first switch with a first control terminal; and a first control node. A second switching circuit comprises: a second input terminal; a second output terminal electrically connected to the first output terminal; a second switch with a second control terminal connected to the first control node; and a second control node connected to the first control terminal. In response to receiving a voltage at the first input terminal, the first switching circuit is configured to control the second switch via the first control node to isolate the second input terminal from the second output terminal. In response to receiving a voltage at the second input terminal, the second switching circuit is configured to control the first switch via the second control node to isolate the first input terminal from the first output terminal.

In another example, the disclosure is directed to a method comprising: receiving, by a switch circuit, a first voltage at a first input terminal, wherein the first voltage is an alternating current (AC) voltage. In response to receiving the first voltage at the first input terminal, outputting a control signal to a first control terminal, wherein the control signal electrically disconnects a second input terminal from a transistor driver circuit.

The details of one or more examples of the disclosure are set forth in the accompanying drawings and the description below. Other features, objects, and advantages of the disclosure will be apparent from the description and drawings, and from the claims.

DETAILED DESCRIPTION

Figure 1:
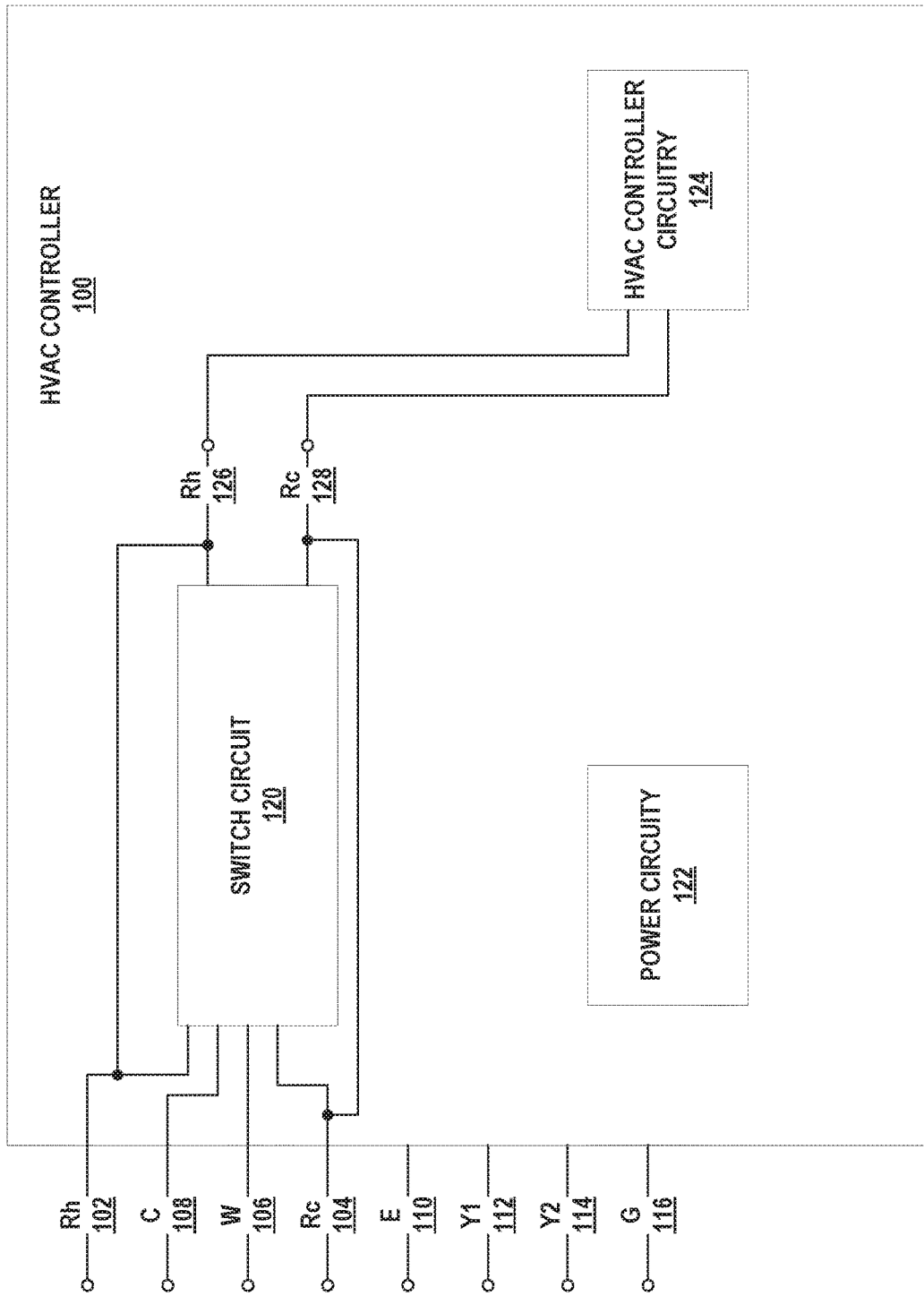
FIG. 1 is a block diagram illustrating an example of an HVAC controller that includes the switch circuit of this disclosure.

FIG. 1 is a block diagram illustrating an example of an HVAC controller that includes the switch circuit of this disclosure. HVAC controller 100 may be configured to control the comfort level (e.g., temperature and/or humidity) in a building by activating and deactivating in a controlled manner one or more components of an HVAC system for the building. Examples of HVAC components may include, but is not limited to, a furnace, a heat pump, an electric heat pump, a geothermal heat pump, an electric heating unit, an air conditioning (AC) unit, a humidifier, a dehumidifier, an air exchanger, an air cleaner, a damper, a valve, a fan, and/or the like.

HVAC controller 100 may be configured to control HVAC components via a wired or wireless communication link. In an example wired communication link HVAC controller 100 may connect to a plurality of wires, which may be referred to as field wires. In some examples, HVAC controller 100 may be a thermostat, such as, for example, a wall mountable thermostat. In some examples, HVAC controller 100 may be programmable to allow for user-defined temperature set points to control the temperature of a building. Based on sensed temperature of one or more rooms in the building, HVAC controller 100 may turn on or off HVAC components to reach the user-defined temperature set point. In some examples, HVAC controller 100 may be configured to control other systems the building, including a security system.

In the example of FIG. 1, HVAC controller 100 includes switch circuit 120, HVAC controller circuitry 124, power circuitry 122 and a several connection terminals. Some examples of connection terminals may include the terminals listed below in Table 1. In other examples, HVAC controller 100 may additional or fewer connection terminals, depending on the equipment included with the HVAC system. In some examples, the connection terminals may be referred to as field wire terminals.

TABLE 1

HVAC Signals

| Signal ID | Wire Color Code | Description |
| --- | --- | --- |
| R | Red | Power, 24 Vac transformer (not shown in FIG. 1) |
| Rc 102 | Red | Power - cooling, 24 Vac transformer |
| Rh 104 | Red | Power - heat, 24 Vac transformer |
| C 108 | Black/Blue | Common of 24 Vac transformer |
| W o rW1 106 | White | Primary heat cell relay |
| E 110 | Brown | Emergency heat relay |
| Y or Y1 112 | Yellow | Primary cool call relay |
| Y2 114 | Yellow | Secondary cool call relay |
| G 116 | Green | Fan relay |
| O/B | Reversing valve | Control for heat pump reversing valve (not shown in FIG. 1) |

Switch circuit 120 may be configured to receive power from either a single power source or dual power source HVAC system. Switch circuit 120 includes two power input terminals Rh 102 and Rc 104 and two power output terminals Rh 126 and Rc 128. For a single power source HVAC system, switch circuit 120 may receive the single power source at either of power input terminals Rh 102 or Rc 104. Switch circuit 120 may provide power to HVAC controller 100 without regard to which of the power input terminals the single power source is connected. For a single power source, switch circuit 120 may be configured to short power output terminal Rh 126 to power output terminal Rc 128 to provide power to both power output terminals.

For a dual power source HVAC system, switch circuit 120 may connect to the dual power sources, e.g. AC power stepped down from line voltage. One power source may connect to power input terminal Rh 102 and the second power source may connect to power input terminal Rc 104. Within HVAC controller 100, the power received at power input terminal Rh 102 connects to power output terminal Rh 126. Similarly, the power received at power input terminal Rc 104 connects to power output terminal Rc 128. For dual power source HVAC system, switch circuit 120 may be configured to isolate the power at Rc 128 from the power at Rh 126.

Switch circuit 120 may be implemented in several ways. Some example implementations may include discrete components, an integrated circuit, circuitry controlled by one or more processors or any combination of the foregoing. In some examples, using discrete components may provide advantages in cost and simplicity over other techniques.

In some examples, the power source is alternating current (AC) power and may be reduced from line voltage. For example, in North America HVAC applications, line power may be approximately 120 VAC. The input power to either Rh 102 or Rc 104 may be stepped down, e.g. via a transformer, to for example 24 VAC.

HVAC control circuitry 124 may be configured to receive power from either of power output terminals Rh 126 or Rc 128, in the example of a single source. In the example of a dual power source HVAC system, HVAC control circuitry 124 may receive power from both power output terminals Rh 126 and Rc 128. HVAC control circuitry 124 may be configured to perform other HVAC control functions such as receive signals from temperature, humidity and other types of sensors and control the equipment in the HVAC system to cause the environment in a building to move toward a specified setpoint, e.g. a specified temperature. HVAC control circuitry 124 may include one or more processors that perform certain HVAC functions, e.g. programmed environmental control based on time of day, and may include communications with external computing devices. HVAC control circuitry 124 may also connect directly to one or more connection terminals (not shown in FIG. 1).

Examples of one or more processors in HVAC controller circuitry 124, switch circuit 120 or in power circuitry 122 may include any one or more of a microcontroller (MCU), e.g. a computer on a single integrated circuit containing a processor core, memory, and programmable input/output peripherals, a microprocessor (μP), e.g. a central processing unit (CPU) on a single integrated circuit (IC), a controller, a digital signal processor (DSP), an application specific integrated circuit (ASIC), an integrated AC switching circuit, a field-programmable gate array (FPGA), a system on chip (SoC) or equivalent discrete or integrated logic circuitry. A processor may be integrated circuitry, i.e., integrated processing circuitry, and that the integrated processing circuitry may be realized as fixed hardware processing circuitry, programmable processing circuitry and/or a combination of both fixed and programmable processing circuitry. Accordingly, the terms "processing circuitry," "processor" or "controller," as used herein, may refer to any one or more of the foregoing structures or any other structure operable to perform techniques described herein. Processing circuitry may be operably coupled to a memory, such as RAM, ROM, or similar computer readable storage media, that may store instructions executed by the processing circuitry, as well as data, settings, flags or other items accessed by the processing circuitry.

Power circuitry 122 may connect to one or more connection terminals, including Rh 102 and Rc 104. In some examples, power circuitry 122 may be configured to perform power stealing or other functions. In some examples, power circuitry 122 may control one or more switches and may turn off the HVAC system for short periods to get the required current from the HVAC system load, i.e. power stealing. The controllable switching functions of power circuitry 122 may be implemented by a variety of techniques including an electromechanical switch, a solid state switch and similar techniques.

Switch circuit 120 may provide several advantages over other types of HVAC controllers. As one example, because switch circuit 120 may be implemented without a processor, then no software is needed for the functions of switch circuit 120. Also, switch circuit 120 may operate on either Rh 102 or Rc 104 power input terminals in single wire (single power source) configuration. Switch circuit 120 may also operate on both Rh 102 and Rc 104 in a two wire (dual power source) configuration. Switch circuit 120 may operate correctly in a dual power source configuration, even when the AC power sources are not in phase. Switch circuit 120 may eliminate the need for a mechanical switch, a jumper wire, or a Rh/Rc switch found in other examples of thermostats.

Use of an HVAC controller with switch circuit 120 may simplify the setup so a user can install the HVAC controller easily without confusion.

Figure 2:
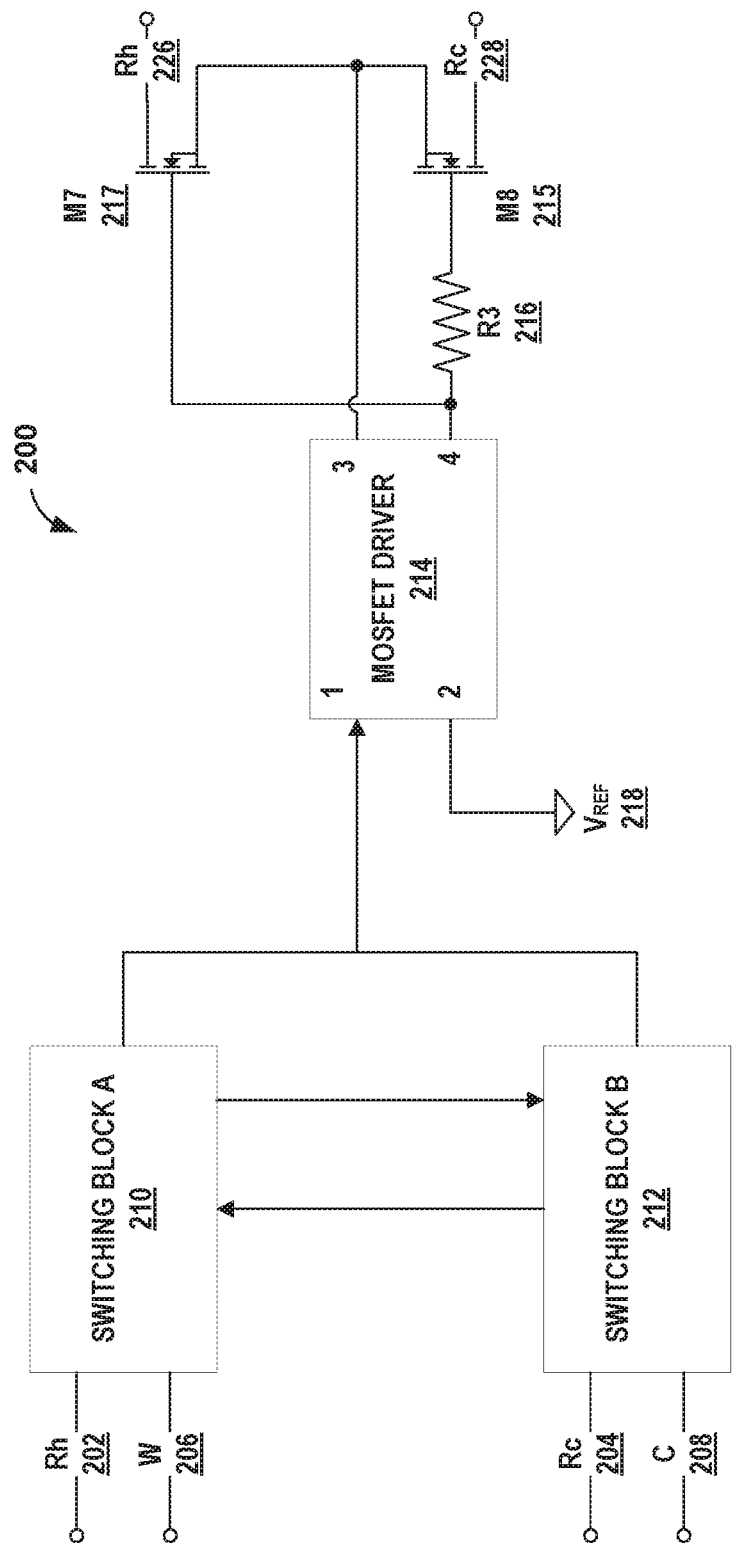
FIG. 2 is a block diagram illustrating an example implementation of the switch circuit of this disclosure.

FIG. 2 is a block diagram illustrating an example implementation of the switch circuit of this disclosure. Switch circuit 200 is an example of switch circuit 120 described above in relation to FIG. 1. The functions and characteristics of switch circuit 200 are the same as those described above for switch circuit 120. The example of FIG. 2 depicts one possible implementation of a switch circuit of this disclosure. Other possible implementations, however, also fall within the scope of this disclosure.

Switch circuit 200 includes switching block A 210, switching block B 212, MOSFET driver 214, and a back-to-back MOSFET configuration, which includes M7 217 and M8 215. Switch circuit 200 includes two power input terminals Rh 202 and Rc 204 and two power output terminals Rh 226 and Rc 228. As with switch circuit 120, described above in relation to FIG. 1, for a single power source HVAC system, switch circuit 200 may receive the single power source at either of power input terminals Rh 202 or Rc 204. Switch circuit 200 may provide power to an HVAC controller without regard to which of the power input terminals the single power source is connected. As described above in relation to FIG. 1, the power received at power input terminal Rh 202 connects to power output terminal Rh 226. Similarly, the power received at power input terminal Rc 204 connects to power output terminal Rc 228. For dual power source HVAC systems, the components of switch circuit 200 may isolate terminal Rc 228 from terminal Rh 226 by turning OFF back-to-back MOSFETs M7 217 and M8 215.

A single power source may also be described as delivering a voltage to an input terminal. For example, for a single power source system, power input terminal Rh 202 may receive a voltage while power input Rc 204 does not receive a voltage or receives a second voltage of approximately zero volts. A single power system may also provide a voltage to power input terminal Rc 204, while power input terminal Rh 202 may receive no voltage, or if connected to a field wire, may receive zero volts, or approximately zero volts. The term "approximately zero volts" in this disclosure means zero volts, within measurement tolerances. Any connection may have some small noise voltages that may not affect the operation of the system, which may be considered "approximately zero volts."

Switching block A 210 is a switching circuit that connects to input terminals Rh 202 and W 206. In some examples power circuitry 122, described above in relation to FIG. 1, may control a switch connected between Rh 202 and W 206 (not shown in FIG. 2) as part of the power stealing functions of power circuitry 122. The call for heat connection, W 206 may also connect to other portions of an HVAC controller, such as HVAC controller 100 described above in relation to FIG. 1. Switching block A 210 is configured to output a signal to terminal 1 of MOSFET driver 214 when a single power source is connected to Rh 202 and Rc 204 is not connected to a power source.

Switching block B 212 a switching circuit that connects to input terminals Rc 204 and the common terminal C 208. In the example of a single source HVAC system with the power output of the transformer connected to Rc 204, the power transformer may be connected between Rc 204 and C 208 (not shown in FIG. 2). Similarly, for a dual power HVAC system, one of the two power transformers may be connected between Rc 204 and C 208 (not shown in FIG. 2). Switching block B 212 is configured to output a signal to terminal 1 of MOSFET driver 214 when the single power source is connected to Rc 204 and not connected to Rh 202.

In the example of FIG. 2, terminal 2 of MOSFET driver 214 connects to a reference voltage, Vref 218. In some examples, Vref 218 may be a ground connection. Terminal 3 of MOSFET driver 214 connects to the sources of transistor M7 217 as well as transistor M8 215. In the example of FIG. 2, transistors M7 217 and M8 215 are enhancement N-channel metal oxide semiconductor field effect transistors (MOSFET). Terminal 4 of MOSFET driver 214 connects to the gate of M7 217. Terminal 4 of MOSFET driver 214 also connects to the gate of M8 215 through resistor R3 216. The outputs of switch circuit 200 include Rh 222, connected to the drain of M7 217 and Rc 224, connected to the drain of M8 215. Similar to switch circuit 120 described above in relation to in FIG. 1, switch circuit 200 includes two power output terminals Rh 226 and Rc 228 and each switch block includes an output terminal to the input terminal 1 of MOSFET driver 214.

In some examples, MOSFET driver 214 is an isolated MOSFET driver that may include isolation between the input terminal 1 and the output terminals 3 and 4 of MOSFET driver 214. MOSFET driver 214 may be isolated by capacitive coupling, galvanic isolation or other techniques. In some examples, MOSFET driver 214 may be implemented by a variety of circuits, including APVC201P by Panasonic as one example.

Switching block A 210 may output a signal from a control node of switching block A 210 to a control terminal of switching block B 212. Switching block A 210 may receive an input signal at a control terminal of switching block A 210 from a control node of switching block B 212. In operation, in a single power source example, AC power may be applied to Rh 202. Switching block A 210 outputs a signal to the control terminal of switching block B 212 to prevent signals from switching block B 212 from reaching MOSFET driver 214. Switching block A 210 outputs a signal to MOSFET driver 314 that causes the back-to-back MOSFETs M7 217 and M8 215 to turn on. Rh 222 and Rc 224 are short-circuited and an AC voltage, e.g. 24 VAC, appears on Rc 224 and provide a power to the thermostat.

Similarly, when AC power is applied to Rc 204 in the single power source example, switching block B 212 outputs a signal to from a control node to a control terminal of switching block A 210 to prevent signals from switching block A 210 from reaching MOSFET driver 214. Switching block B 212 outputs a signal to MOSFET driver 314 that causes the back-to-back MOSFETs M7 217 and M8 215 to turn on. Rh 222 and Rc 224 are short-circuited and an AC voltage, appears on Rc 224 and provide a power to the thermostat.

In dual power source configuration, the AC power may be applied simultaneously to Rh 202 and Rc 204. The signal from switching block A 210 blocks the output from switching block B 212 from reaching MOSFET driver 214. At the same time the signal from switching block B 212 prevents the output from switching block A 210 from reaching MOSFET driver 214. Therefore, both back-to-back MOSFETS M7 217 and M8 215 are OFF and remains open and isolated, so the two 24 VAC signals at Rh 222 and Rc 224 operate independently without shorting. As described above in relation to FIG. 1, switching block A 210, switching block B 212 and MOSFET driver 214 may be implemented by any one or more discrete components, an integrated circuit, logic circuitry and other forms of processing circuitry.

Figure 3:
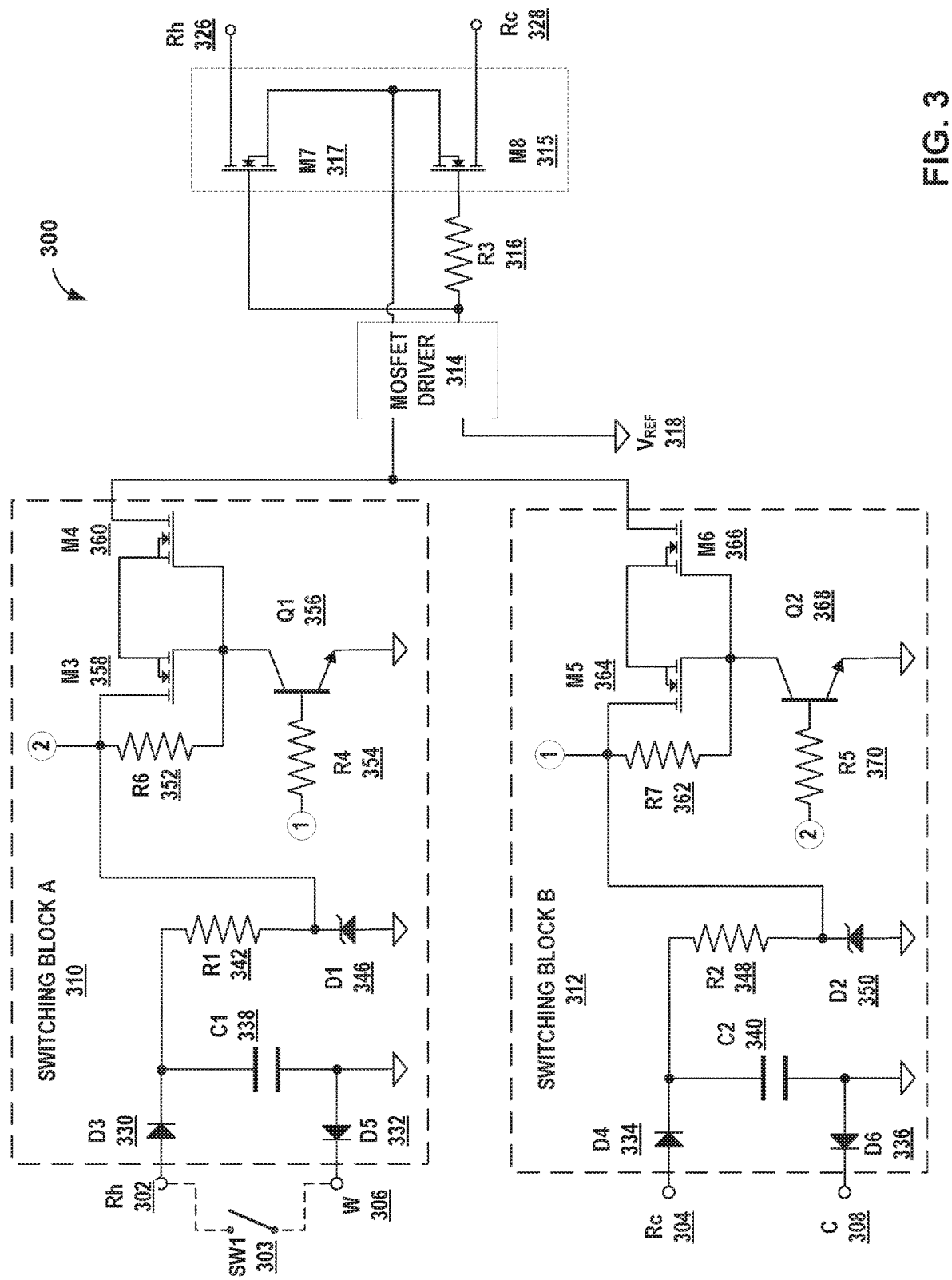
FIG. 3 is a schematic diagram illustrating an example implementation of the switch circuit of this disclosure.

FIG. 3 is a schematic diagram illustrating an example implementation of the switch circuit of this disclosure.

Circuit 300 of FIG. 3 is an example of switching circuit 120 and switch circuit 200 described above in relation to FIGS. 1 and 2.

Circuit 300 includes switching block A 310, switching block B 312, MOSFET driver 314, and a back-to-back MOSFET configuration, which includes M7 317 and M8 315. Switching block A 310, switching block B 312, MOSFET driver 314, and transistors M7 317 and M8 315 are examples of switching block A 210, switching block B 212, MOSFET driver 214, and transistors M7 217 and M8 215 described above in relation to FIG. 2 and have the same characteristics and functions.

As with switch circuit 200, circuit 300 includes two power input terminals Rh 302 and Rc 304 and two power output terminals Rh 326 and Rc 328. Circuit 200 may receive the single power source at either of power input terminals Rh 202 or Rc 204.

Switching block A 310 connects to input terminals Rh 302 and W 306. In some examples power circuitry 122, described above in relation to FIG. 1, may control a SW1 303 connected between Rh 302 and W 306 as part of the power stealing functions of power circuitry 122.

Rh 302 connects to the anode of diode D3 330. The cathode of D3 330 connects to a first terminal of capacitor C1 338 as well as to the cathode of Zener diode D1 346 through resistor R1 342. The cathode of diode D5 332 connects to W 306 and the anode connects to a reference, e.g. ground. All the ground symbols in switching block A 310 and switching block B 312 may be considered to be connected to Vref 318.

The cathode of Zener diode D1 346 connects to the drain of transistor M3 358 and to a first terminal of resistor R6 352. The node including the cathode of D1 346 may be referred to as the control node for the control terminal connected to the base of transistor Q2 368. The anode of D1 346 connects to ground. Transistor M3 358 and M4 360 form a another back-to-back MOSFET pair, similar to output transistors M7 317 and M8 315. The source of M3 358 connects to the source of M4 360 and the drain of M4 360 connects to the input terminal of MOSFET driver 314. In the example of FIG. 3, M3 358 and M4 360 are enhancement N-channel MOSFETs.

The gates of MOSFETs M3 358 and M4 360 connect to the drain of MOSFET M3 358 through resistor R6 352 as well as to the collector of bipolar junction transistor (BJT) Q1 356. The emitter of Q1 356 connects to ground. The base of Q1 356 connects to the drain of M5 364 via resistor R4 354, as depicted by the circled 1 terminal. The connection to the base of Q1 356 may be referred to as the control terminal for Q1, which is controlled by the control node that includes the cathode of D2 350. In this manner the gates of MOSFETs M3 358 and M4 360 are controlled by the voltage at the control node that also includes the drain of M5 364. A sufficient voltage at the drain of M5 364 signals Q1 356 to turn ON pulling the gates of back-to-back pair M3 358 and M4 360 to ground, which turns OFF M3 358 and M4 360, preventing the constant voltage signal output from switching block A 310 from reaching MOSFET driver 314. In this disclosure, the "sufficient voltage" means a voltage above a threshold, such as above 5V, that is sufficient to ensure Q1 356 turns ON. In the example of switch circuit 300, the voltage at the drain of M5 364 is clamped by Zener diode D2 350.

In some examples, switching block A 310 and switching block B 312 may be referred to as a "constant voltage circuit," because the output signal to MOSFET driver circuit 314 from M4 360 or M6 366 may be a voltage that is approximately constant. In this disclosure "approximately constant" is means a steady, constant voltage as measurable within manufacturing and measurement tolerances.

Switching block B 312 connects to input terminals Rc 304 and the common terminal C 308. In the example of a single source HVAC system with the power output of the transformer connected to Rc 304, the power transformer may be connected between Rc 304 and C 308 (not shown in FIG. 3). Similarly, for a dual power HVAC system, one of the two power transformers may be connected between Rc 304 and C 308 (not shown in FIG. 3). Switching block B 312 outputs a signal to MOSFET driver 314 at the drain of M6 366.

Rc 304 connects to the anode of diode D4 334. The cathode of D4 334 connects to a first terminal of capacitor C2 340 as well as to the cathode of Zener diode D2 350 through resistor R2 349. The cathode of diode D6 336 connects to C 308 and the anode connects to a reference, e.g. ground.

The cathode of Zener diode D2 350 connects to the drain of transistor M5 364 and to a first terminal of resistor R7 362. The anode of D2 350 connects to ground. Transistor M5 364 and M6 366 form a another back-to-back MOSFET pair. The source of M5 364 connects to the source of M6 366 and the drain of M6 366 connects to the input terminal of MOSFET driver 314. In the example of FIG. 3, M5 364 and M6 366 are enhancement N-channel MOSFETs.

The gates of MOSFETs M5 364 and M6 366 connect to the drain of MOSFET M5 364 through resistor R7 362 as well as to the collector of BJT Q2 368. The emitter of Q2 368 connects to ground. The base of Q2 368 connects to the drain of M3 358 via resistor R5 370, as depicted by the circled 2 terminal. In this manner the gates of MOSFETs M5 364 and M6 366 are controlled by the voltage at the drain of M3 358. A sufficient voltage at the drain of M3 358 signals Q2 368 to turn ON pulling the gates of back-to-back pair M3 358 and M4 360 to ground, which turns OFF M5 364 and M6 366, preventing the constant voltage signal output from switching block A 310 from reaching MOSFET driver 314. Similar to Zener diode D2 350 above, the "sufficient voltage" means a voltage above a threshold, such as above 5V, that is sufficient to ensure Q2 368 turns ON. In the example of switch circuit 300, the voltage at the drain of M3 358 is clamped by Zener diode D1 346.

As described above in relation to FIG. 2, a terminal of MOSFET driver 314 connects to a reference voltage, Vref 318, which may be a ground connection. A first output terminal of MOSFET driver 314 connects to the sources of transistor M7 317 as well as transistor M8 315. In the example of FIG. 3, transistors M7 317 and M8 315 are enhancement N-channel metal oxide semiconductor field effect transistors (MOSFET). A second output terminal of MOSFET driver 314 connects to the gate of M7 317. The second output terminal of MOSFET driver 314 also connects to the gate of M8 315 through resistor R3 316. The outputs of switch circuit 300 include Rh 322, connected to the drain of M7 317 and Rc 324, connected to the drain of M8 315. Similar to switch circuit 200 described above in relation to in FIG. 2, switch circuit 200 includes two power output terminals Rh 326 and Rc 328 and each switch block includes an output terminal to the input terminal of MOSFET driver 214. Specifically, the drain of M4 360 is the output terminal for switching block A 310 and the drain of M6 366 is the output terminal of switching block B 312.

As described above in relation to FIG. 2, MOSFET driver 314 may be an isolated MOSFET driver that may include isolation between the input terminal and the first and second output terminals of MOSFET driver 314. For example, MOSFET driver 314 may be isolated by capacitive, galvanic isolation and other techniques. In some examples, MOSFET driver 314 may include an oscillation circuit, a rectification circuit, a control circuit, and other circuitry to perform the functions described by this disclosure. In some examples MOSFET driver 314 may be referred to as a gate driver circuit, and may be implemented as discrete components, and integrated circuit or similar techniques.

Similar to switch circuits 120 and 200 described above in relation to FIGS. 1 and 2, in the one wire configuration, Rh 322 and Rc 324 are shorted when the AC power source is applied to only one of Rh 302 or Rc 304 input terminals. As one example, when AC power, e.g. 24 VAC is applied to Rh 302 from a transformer, an approximately constant voltage may be generated by the half wave rectification and Zener diode D1 346 at the drain of M3 358. Since no voltage is applied to the Rc 304, the voltage at the drain of M3 358 turns on Q2 368 and turns off both back-to-back MOSFETS M5 364 and M6 366 of switching block B 312. The constant voltage at the drain of M3 358 causes both the Rh back-to-back MOSFETs M3 358 and M4 360 to turn ON. Turning ON MOSFETs M3 358 and M4 360 causes a second approximately constant voltage to be output from the drain of M4 360 to the input of MOSFET driver 314. The voltage applied to MOSFET driver 314 causes back-to-back MOS-FETs M7 317 and M8 315 to turn ON. In this manner Rh 322 and Rc 324 are short-circuited and the AC voltage appears on Rc 324 and provides power to the thermostat without regard for which of the two input terminals Rh 302 or Rc 304 receives the input power. In a similar manner, when the AC power is applied to Rc 304, switching block B 312 operates on the same principle as when AC power is applied to Rh 302. Said another way, applying a sufficient voltage to the input of MOSFET driver circuit 314 turns ON the back-to-back MOSFETS M7 317 and M8 315, which shorts output power terminals Rh 322 and Rc 324.

In a two-wire configuration, and AC power is applied simultaneously to Rh 302 and Rc 304, a constant voltage generated by half wave, bridge rectification and Zener diode D1 346 to the drain of M3 358 and by D2 350 to the drain of M5 364. These voltages cause both Q1 356 and Q2 368 to turn ON, pulling the gates of M3 358, M4 360, M5 364 and M6 366 to ground. In other words, both Rh and Rc back-to-back MOSFETs for switching block A 310 (i.e. M3 358 and M4 360) and for switching block B 312 (i.e. M5 364 and M6 366) are turned off. With both sets of back-to-back MOSFETs OFF, no signal reaches MOSFET driver 314 and so the Rh/Rc output back-to-back MOSFETs M7 317 and M8 315 do not operate, remain open and isolates Rh 322 from Rc 324. In this manner the two AC power sources operate independently without shorting.

In some examples, power circuitry 122, described above in relation to FIG. 1, may perform power stealing operation to provide energy for the thermostat and may control one or more switches not shown in FIG. 3. For example, power circuitry 122 may control switch SW1 303 between Rc 302 and W 306. With this power stealing operation, the energy needed for C1 338 may be obtained from Rh 302 each time the HVAC system is turned off.

In more detail, when AC power is applied to Rh 302 in a single transformer HVAC system, while the HVAC system is running, the power circuitry 122 may disconnect from the HVAC system for short intervals to get the required current from the HVAC system load.

When the HVAC system is disconnected (SW1 303 is opened), the AC power applied to Rh 302 is converted to DC through the D3 330, charges C1 338 and clamped to an approximately constant voltage by Zener diode D1 346. When the HVAC system is connected (SW1 303 is closed), the current charged in C1 338 is discharged and maintains the constant voltage at the drain of M3 358. During SW1 303 power stealing operation, C1 338 repeats charging and discharging regardless of HVAC system operation and supplies necessary energy to MOSFET driver 314 through M3 358 and M4 360, which causes MOSFET driver 314 to turn on M7 317 and M8 315, and Rh 322 and Rc 324 are connected to each other.

Figure 4:
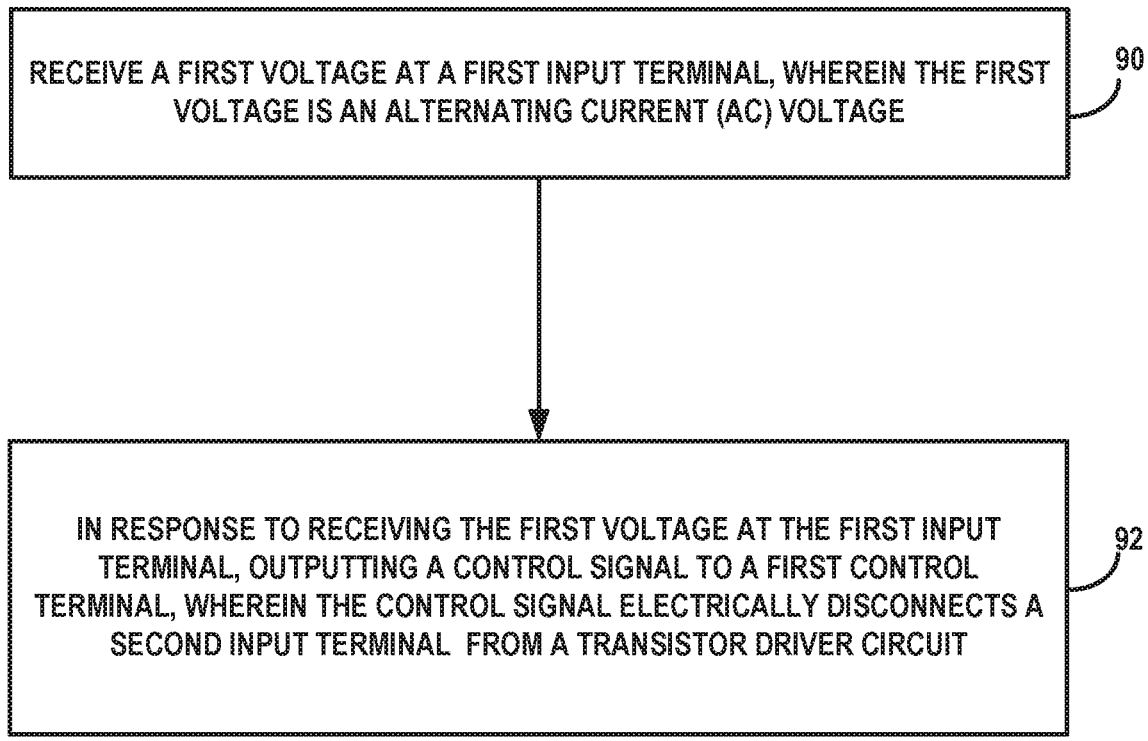
FIG. 4 is a flowchart illustrating an example operation of the switch circuit of this disclosure.

FIG. 4 is a flowchart illustrating an example operation of the switch circuit of this disclosure. The blocks of FIG. 4 will be described in terms of switch circuit 300 of FIG. 3.

As described above, for a single source HVAC system, the AC output voltage from the single source may connect to either power input terminal Rh 302 or power input terminal Rc 304 of the switch circuit. In other words, either terminal Rc 304 or Rh 302 may receive the AC voltage (90). To simplify the explanation of FIG. 4, the single source will be connected to Rc 304.

When AC power, e.g. from a transformer that steps down AC line voltage, is applied to Rc 304, an approximately constant voltage may be generated by Zener diode D1 346 at the drain of M3 358 and the half wave rectification provided by diodes D4 334 and D6 336. Because no voltage, or zero voltage, is applied to the Rh 302, the voltage at the drain of M5 364 turns on Q1 356 and turns off both back-to-back MOSFETS M3 358 and M4 360 of switching block A 310. In other words, a control signal from the drain of M5 364 (at terminal 1) to a control terminal to the gate of Q1 356 through resistor R4 354, electrically disconnects input terminal Rh 302 from MOSFET transistor driver circuit 314 (92).

Similar to the description above in relation to FIG. 3, the voltage at the drain of M5 364 causes both the Rc back-to-back MOSFETs M5 364 and M6 366 to turn ON. Turning ON MOSFETs M5 364 and M6 366 causes a second approximately constant voltage to be output from the drain of M6 366 to the input of MOSFET driver 314. The voltage applied to MOSFET driver 314 causes back-to-back MOS-FETs M7 317 and M8 315 to turn ON, which shorts Rc 324 to Rh 322, and therefore both output power terminals provide the AC voltage which was received by Rc 304.

Various examples of the disclosure have been described. These and other examples are within the scope of the following claims.

What is claimed is:
1. A circuit for receiving power from a heating, ventilation, and air-conditioning device, the circuit comprising:
    a first switching circuit comprising:
        a first input terminal;
        a first output terminal;
        a first switch with a first control terminal; and
        a first control node; and
    a second switching circuit comprising:
        a second input terminal;
        a second output terminal electrically connected to the first output terminal;
    a second switch with a second control terminal connected to the first control node; and
        a second control node connected to the first control terminal;
    wherein:
        in response to receiving a voltage at the first input terminal, the first switching circuit is configured to control the second switch via the first control node to isolate the second input terminal from the second output terminal, and in response to receiving a voltage at the second input terminal, the second switching circuit is configured to control the first switch via the second control node to isolate the first input terminal from the first output terminal.

2. The circuit of claim 1, further comprising a first power output terminal and a second power output terminal, wherein each of the first power output terminal and the second power output terminal is configured to output power received at the first input terminal in response to receiving the voltage at the first input terminal and receiving a voltage of approximately zero volts at the second input terminal.

3. The circuit of claim 1, further comprising a first power output terminal and a second power output terminal, wherein each of the first power output terminal and the second power output terminal is configured to output power received at the second input terminal in response to receiving the voltage at the second input terminal without receiving a voltage at the first input terminal.

4. The circuit of claim 1, further comprising a first power output terminal and a second power output terminal, wherein, in response to receiving both a first voltage at the first input terminal and a second voltage at the second input terminal:

the circuit is configured to isolate the first power output terminal from the second power output terminal;

the first power output terminal is configured to output a first power received at the first input terminal; and second power output terminal is configured to output a second power received at the second input terminal.

5. The circuit of claim 1, further comprising a transistor driver circuit wherein the transistor driver circuit isolates the first power output terminal and the second power output terminal from the first switching circuit and the second switching circuit.

6. The circuit of claim 5, wherein the isolation comprises galvanic isolation.

7. The circuit of claim 5, wherein the isolation comprises capacitive isolation.

8. The circuit of claim 1, further comprising power stealing circuitry.

9. A system for controlling heating, ventilation and air conditioning (HVAC) equipment, the system comprising:

one or more processors configured to receive signals from one or more sensors;

a switch circuit configured to provide power to the system and the one or more processors, the switch circuit comprising:

a first switching circuit comprising:
a first input terminal;
a first output terminal;
and a second switching circuit comprising:
a second input terminal;
a second output terminal electrically connected to the first output terminal;

wherein:
in response to receiving a voltage at the first input terminal, the first switching circuit is configured to isolate the second input terminal from the second output terminal, and in response to receiving a voltage at the second input terminal, the second switching circuit is configured to isolate the first input terminal from the first output terminal.

10. The system of claim 9, wherein:
a first switching circuit comprising:
a first switch with a first control terminal; and
a first control node; and
a second switching circuit comprising:
a second switch with a second control terminal connected to the first control node; and
a second control node connected to the first control terminal;
wherein:
in response to receiving a voltage at the first input terminal, the first switching circuit is configured to control the second switch via the first control node to isolate the second input terminal from the second output terminal, and
in response to receiving a voltage at the second input terminal, the second switching circuit is configured to control the first switch via the second control node to isolate the first input terminal from the first output terminal.

11. The system of claim 9, wherein the switch circuit further comprises a first power output terminal and a second power output terminal, wherein each of the first power output terminal and a second power output terminal is configured to output power received at the first input terminal in response to receiving the voltage at the first input terminal and receiving a voltage of approximately zero volts at the second input terminal.

12. The system of claim 9, wherein the switch circuit further comprises a first power output terminal and a second power output terminal, wherein each of the first power output terminal and a second power output terminal is configured to output power received at the second input terminal in response to receiving the voltage at the second input terminal and receiving a voltage of approximately zero volts at the first input terminal.

13. The system of claim 9, wherein the switch circuit further comprises a first power output terminal and a second power output terminal, wherein, in response to receiving both a first voltage at the first input terminal and a second voltage at the second input terminal:

the switch circuit is configured to isolate the first power output terminal from the second power output terminal;
the first power output terminal is configured to output a first power received at the first input terminal; and
second power output terminal is configured to output a second power received at the second input terminal.

14. The system of claim 9, wherein the switch circuit further comprises a transistor driver circuit wherein the transistor driver circuit isolates the first power output terminal and the second power output terminal from the first switching circuit and the second switching circuit.

15. A method comprising:
receiving, by a switch circuit, a first voltage at a first input terminal, wherein the first voltage is an alternating current (AC) voltage; and in response to receiving the first voltage at the first input terminal, outputting a control signal to a first control terminal, wherein the control signal electrically disconnects a second input terminal from a transistor driver circuit.

16. The method of claim 15, further comprising:
in response to receiving the first voltage at the first input terminal, outputting a direct current (DC) voltage to the transistor driver circuit; and
in response to receiving the DC voltage, turning ON a transistor pair, wherein turning ON the transistor pair electrically connects a first power output terminal to a second power output terminal, wherein the first input terminal is electrically connected to the first output terminal.

17. The method of claim 15, further comprising:
in response to receiving the first voltage at the first input terminal at the same time as a second voltage at the second input terminal, isolating a first power output terminal from a second power output terminal, wherein:
the first input terminal is electrically connected to the first power output terminal, and
the second input terminal is electrically connected to the second power output terminal.

* * * * *